(12) United States Patent
Gardin

(10) Patent No.: US 7,599,186 B2
(45) Date of Patent: Oct. 6, 2009

(54) HEAT CONDUCTION BUS, PARTICULARLY FOR A MICROPROCESSOR-BASED COMPUTATION UNIT

(75) Inventor: Philippe Gardin, Merville (FR)

(73) Assignee: Continental Automotive France, Toulouse (FR)

( * ) Notice: Subject to any disclaimer, the term of this patent is extended or adjusted under 35 U.S.C. 154(b) by 5 days.

(21) Appl. No.: 11/944,500

(22) Filed: Nov. 23, 2007

(65) Prior Publication Data

US 2008/0123290 A1    May 29, 2008

(30) Foreign Application Priority Data

Nov. 23, 2006    (FR)    ................................. 06 10264

(51) Int. Cl.
*H05K 7/20*    (2006.01)
*F28F 7/00*    (2006.01)

(52) U.S. Cl. ..................... 361/704; 361/719; 361/720; 165/80.2; 165/185

(58) Field of Classification Search ................. 361/719, 361/775
See application file for complete search history.

(56) References Cited

U.S. PATENT DOCUMENTS

| 4,254,447 | A | * | 3/1981 | Griffis | ........................ 361/719 |
| 4,625,260 | A | * | 11/1986 | Jordan et al. | ................. 361/720 |
| 4,904,192 | A | | 2/1990 | Holden et al. | |
| 5,181,866 | A | * | 1/1993 | Jerome et al. | ................ 439/850 |
| 5,474,475 | A | * | 12/1995 | Yamaguchi | ............ 439/620.27 |
| 5,618,187 | A | * | 4/1997 | Goto | ........................... 439/79 |
| 5,624,269 | A | | 4/1997 | Kanamori | |
| 6,302,709 | B1 | | 10/2001 | Ross | |
| 6,351,385 | B1 | * | 2/2002 | Featherstone, III | .......... 361/704 |
| 6,385,052 | B2 | * | 5/2002 | Svensson | ..................... 361/775 |
| 6,461,172 | B2 | * | 10/2002 | Ross | ........................... 439/78 |
| 6,702,595 | B2 | * | 3/2004 | Nelson et al. | ................. 439/83 |
| 7,273,398 | B2 | * | 9/2007 | Taylor et al. | ............. 439/620.2 |

\* cited by examiner

*Primary Examiner*—Gregory D Thompson
(74) *Attorney, Agent, or Firm*—Young & Thompson

(57) ABSTRACT

A heat conduction bus, particularly for a microprocessor-based computation unit, includes a single starting end, a heat-conducting strip (1) provided with a plurality of tabs (7-12) for solder-connecting to the connection terminals of electronic components likely to become hot, and a collector (4) joined to the strip (1) and arranged so as to channel and evacuate the thermal energy drained by the tabs (7-12) and passing through the strip (1). The heat conduction bus includes, at least in line with each of the tabs (11, 12) geometrically the closest to the collector (4), an opening (13, 14) provided in the strip (1) near to the tab (11, 12), so as to be located interposed between the tab and the collector (4) and to form an obstacle opposing the direct routing of the thermal energy between this tab (11, 12) and the collector.

5 Claims, 1 Drawing Sheet

HEAT CONDUCTION BUS, PARTICULARLY FOR A MICROPROCESSOR-BASED COMPUTATION UNIT

FIELD OF THE INVENTION

The invention relates to a heat conduction bus, particularly for a microprocessor-based computation unit.

BACKGROUND OF THE INVENTION

More specifically, the invention aims for a heat conduction bus comprising, from a single starting end, a heat-conducting strip provided with a plurality of tabs for solder-connecting to the connection terminals of electronic components likely to become hot, and a collector joined to the strip and arranged so as to channel and evacuate the thermal energy drained by the tabs and passing through the strip.

Such buses are in particular used in the automotive field as "heat sinks" to evacuate the thermal energy supplied by the electronic components of printed circuits.

One of the main obstacles encountered with such buses lies in the fact that, in the soldering operation, it is very difficult to obtain a compromise regarding the parameters of this soldering operation (preheat time and temperature, soldering time, etc.) to ensure a correct soldering for each of the tabs.

In practice, these parameters are the same for all the tabs whereas they should, in an optimal but not practically achievable way, be adapted to each tab to take account of the positioning differences of the latter relative to the collector, which condition the propagation parameters of the thermal energy towards said collector. In practice, when the temperature of a tab located close to the collector is raised, to solder it, it is difficult to bring it quickly to the requisite soldering temperature because the heat is dispersed to the collector and evacuated. This is, moreover, quite normal, since the collector, in normal conditions of use, handles heat evacuation. However, during the soldering of the tabs, it would be desirable for the collector not to provide this heat evacuation function so that the tabs could quickly reach their soldering temperature regardless of their position relative to the collector.

In practice, at the present time, it appears that these difficulties often have the direct consequences of producing soldering conditions (in particular preheat time) that do not make it possible to guarantee a systematic correct soldering of the tabs closest to the collector.

The result of this is that a not-unimportant number of tabs are in fact simply "stuck" to the corresponding connection terminals and not properly soldered to the latter, with the consequential major risks of breaking of the link.

SUMMARY OF THE INVENTION

The invention aims to overcome this drawback, with the main objective being to provide a very cost-effective solution that makes it possible to obtain one and the same heat gradient in all the tabs of a heat conduction bus, and so leads to a uniform quality of the solder joints of said tabs regardless of their position relative to the heat collector. In particular, the object of the present invention is to enable tabs connected to a heat collector to heat up rapidly when they are soldered and not to heat up when the heat bus is operating normally.

To this end, the aim of the invention is a heat conduction bus of the type described in the above preamble, also comprising, at least in line with each of the tabs geometrically the closest to the collector, an opening provided in the strip near to the tab, so as to be located interposed between said tab and the collector and to form an obstacle opposing the direct routing of the thermal energy between this tab and said collector.

The invention therefore consisted in providing in the strip, in line with the tabs geometrically the closest to the collector, a simple opening, the form and dimensions of which can advantageously be determined by simulations which:
- opposes the propagation of the heat for a very short time advantageously determined to correspond to the time required by the soldering operation,
- does not however oppose the heat sink function of the bus when the latter is being used conventionally, that is, for operating cycles of the order of several minutes (generally greater than 20 minutes in practice).

This solution, involving a simple additional machining of the current buses, with no impact on the price of the latter, therefore makes it possible to make uniform the parameters of the soldering operations (preheat time and temperature, soldering time, etc.) required to ensure a correct soldering for each of the tabs.

According to an advantageous embodiment of the invention aiming for a heat conduction bus in which each tab extends orthogonally relative to an edge of the strip, each opening consists of a slot having at least a longitudinal axis orthogonal to the tab.

In addition, each of these slots is advantageously provided at a distance from the corresponding edge of the strip suitable for delimiting, relative to said edge, a strip of material of minimum width designed to ensure the mechanical withstand strength of the strip.

Moreover, when the conduction bus comprises a tab provided in the extension of a corner of the strip, the corresponding slot advantageously takes the form of a V, the two branches of which extend parallel to the edges of the strip delimiting the corner in which the tab is provided.

BRIEF DESCRIPTION OF THE DRAWING

Other characteristics, aims and advantages of the invention will become apparent from the detailed description that follows with reference to the appended drawing, which represents by way of nonlimiting example one preferred embodiment thereof. In this drawing, the single

DETAILED DESCRIPTION OF EMBODIMENTS

Figure 1:
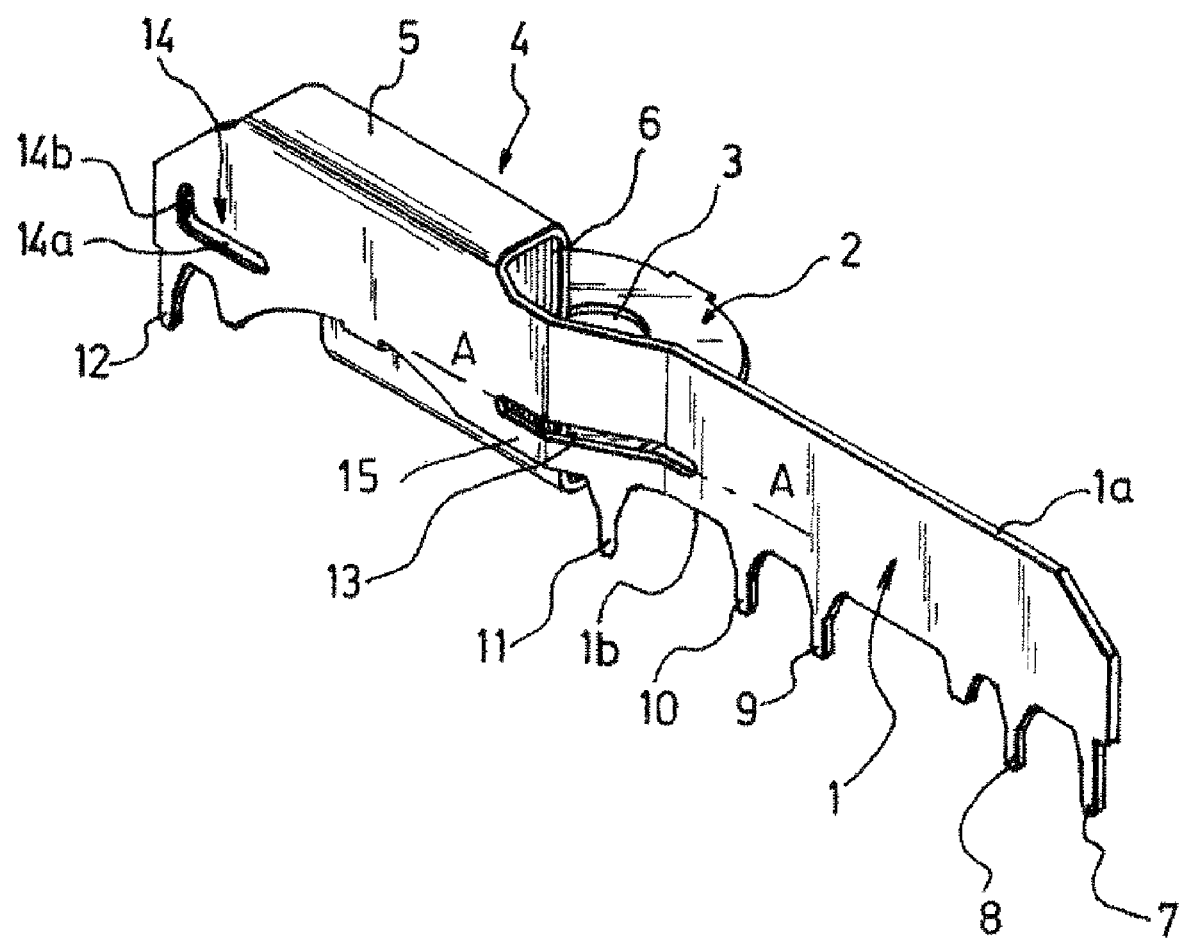
FIG. 1 is a perspective view of a heat conduction bus according to invention.

The heat conduction bus according to invention represented by way of example in FIG. 1 is intended to be connected to a motor vehicle battery in order to provide, on the one hand, the electrical power supply for electronic components, in particular a microprocessor-based computation unit, and on the other hand, the evacuation of the thermal energy produced by these components.

Usually, this bus comprises a strip 1 formed by a roughly flat plate having a generally parallelepipedal form, delimited in particular by two parallel longitudinal edges 1a and 1b.

This bus also comprises a ring terminal 2 provided with an orifice 3 for it to be mounted on a battery terminal. This ring terminal 2, which extends in a plane orthogonal to that of the strip 1, is linked to one of the longitudinal edges 1a thereof, near to one end of said longitudinal edge, by a joining piece, or collector, 4 in the form of an L (inverted L in the case of FIG. 1) comprising:
- a wing 5 for joining to the longitudinal edge 1a, perpendicular to the plane of the strip 1, and a wing 6 for joining to the ring terminal 2, extending parallel to the plane of the strip 1.

This bus also comprises a plurality of connecting tabs 7 to 12 taking the general form of teeth extending perpendicularly relative to the other longitudinal edge 1*b* of the strip 1, two of said teeth, in particular, each being positioned at one end of said longitudinal edge.

According to the invention, the strip 1 is finally pierced, in line with each of the tabs geometrically the closest to the collector 4, in this example the tabs 11 and 12 positioned either side of this collector 4, with an opening 13, 14 provided near to said tab, so as to be located interposed between the latter and the collector 4, and to form an obstacle opposing the direct routing of the thermal energy between this tab 11, 12 and said collector.

Concerning the tab 11 provided in the intermediate position along the longitudinal edge 1*b*, this opening 13 consists of a slot 13:

extending either side of the tab 11, along a longitudinal axis A parallel to the longitudinal edge 1*b*, provided at a distance from the longitudinal edge 1*b* suitable for delimiting, relative to said edge, a strip of material 15 of minimum width designed to ensure the mechanical withstand strength of the strip 1.

Regarding the tab 12 provided at one end of the longitudinal edge 1*b*, in the extension of a corner of the strip 1, the corresponding slot 14 takes the form of an L, the two branches 14*a*, 14*b* of which extend parallel to the edges of the strip 1 delimiting said corner.

The function of these simple slots 13, 14 is to oppose the propagation of the heat for a very short time advantageously determined to correspond to the time required by the soldering operation. They also make it possible to standardize the parameters of the soldering operation (preheat time and temperature, soldering time, etc.) required to ensure a correct soldering for each of the tabs.

It is thus possible to solder the tabs of the heat bus by applying a uniform soldering time (time to raise the tab to the soldering temperature), regardless of the position of the tab relative to the collector.

It will be noted that the openings 13, 14 according to the invention make it possible to contain the heat due to the soldering operation in each tab at the time of soldering, without however hampering the propagation of this heat to the collector when the heat bus needs to be used as a heat sink. These openings can therefore be used to produce a two-fold function (being contradictory), namely to contain the heat when the tab is subjected to a rapid temperature rise and to dissipate this heat when the tab is subjected to a long-term temperature rise.

The invention claimed is:

1. A heat conduction bus, particularly for a microprocessor-based computation unit, comprising, from one end of the bus to an opposing end:

a heat-conducting strip provided with a plurality of tabs for solder-connecting to respective connection terminals of electronic components likely to become hot; and a collector joined to the heat-conducting strip and arranged so as to channel and evacuate thermal energy drained by the plurality of tabs and passing through the strip, said heat conduction bus further comprising, at least with respect to ones of the plurality of tabs geometrically closest to the collector, an opening provided in the heat-conducting strip near to said ones of the plurality of tabs, so as to be located interposed between said ones of the plurality of tabs and the collector and to form an obstacle opposing direct routing of the thermal energy between said ones of the plurality of tabs and said collector.

2. The conduction bus as claimed in claim 1, wherein each of said plurality of tabs extends orthogonally relative to an edge of the heat-conducting strip, and wherein said opening consists of a slot having at least a longitudinal axis orthogonal to the plurality of tabs.

3. The conduction bus as claimed in claim 2, wherein said slot is provided at a distance from a corresponding edge of the heat-conducting strip suitable for delimiting, relative to said corresponding edge, a strip of material of minimum width designed to ensure a mechanical withstand strength of the heat-conducting strip.

4. The conduction bus as claimed in claim 1, wherein one of said plurality of tabs is provided in an extension of a corner of the heat-conducting strip and wherein said opening includes a slot, the slot takes a form of a V, two branches of which extend parallel to edges of the heat-conducting strip delimiting the corner in which said one of the plurality of tabs is provided.

5. The conduction bus as claimed in claim 2, wherein one of said plurality of tabs is provided in an extension of a corner of the heat-conducting strip, and wherein the slot takes the form of a V, two branches of which extend parallel to edges of the heat-conducting strip delimiting the corner in which said one of the plurality of tabs is provided.

* * * * *